United States Patent
Cui et al.

(10) Patent No.: US 6,905,909 B2
(45) Date of Patent: Jun. 14, 2005

(54) ULTRA LOW DIELECTRIC CONSTANT THIN FILM

(75) Inventors: Hao Cui, West Linn, OR (US); Peter A. Burke, Portland, OR (US); Wilbur G. Catabay, Saratoga, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/691,400

(22) Filed: Oct. 22, 2003

(65) Prior Publication Data

US 2005/0090036 A1 Apr. 28, 2005

(51) Int. Cl.$^7$ .............................................. H01L 21/00
(52) U.S. Cl. ................. 438/105; 438/624; 438/629; 438/643; 438/200; 438/778
(58) Field of Search ................. 438/624, 629, 438/643, 200, 778

(56) References Cited

U.S. PATENT DOCUMENTS

2005/0009320 A1 * 1/2005 Goundar

* cited by examiner

Primary Examiner—David Nelms
Assistant Examiner—Mai-Huong Tran
(74) Attorney, Agent, or Firm—Luedeka, Neely & Graham, P.C.

(57) ABSTRACT

A method for forming a substantially oxygen-free silicon carbide layer on a substrate, where the silicon carbide layer has a dielectric constant of less than about four. The substrate is held at a deposition temperature of between about zero centigrade and about one hundred centigrade, and a gas flow of tetramethylsilane is introduced at a rate of no more than about one thousand scientific cubic centimeters per minute. The deposition pressure is held between about one milli Torr and about one hundred Torr, and a radio frequency plasma discharge is produced with a power of no more than about two kilowatts. The plasma discharge is halted when a desired thickness of the silicon carbide layer has been formed.

12 Claims, 5 Drawing Sheets

ULTRA LOW DIELECTRIC CONSTANT THIN FILM

FIELD

This invention relates to the field of integrated circuit fabrication. More particularly, this invention relates to advanced materials for use as non electrically conducting layers.

BACKGROUND

As integrated circuits have become increasingly smaller, electrically conductive structures within the integrated circuits are placed increasingly closer together. This situation tends to enhance the inherent problem of parasitic capacitance between adjacent electrically conductive structures. Thus, new electrically insulating materials have been devised for use between electrically conductive structures, to reduce such capacitance problems. The new electrically insulating materials typically have lower dielectric constants, and thus are generally referred to as low k materials. While low k materials help to resolve the capacitance problems described above, they unfortunately tend to introduce new challenges.

Low k materials are typically filled with small voids that help reduce the material's effective dielectric constant. Thus, there is less of the material itself within a given volume, which tends to reduce the structural strength of the material. The resulting porous and brittle nature of such low k materials presents new challenges in both the fabrication and packaging processes. Unless special precautions are taken, the robustness and reliability of an integrated circuit that is fabricated with low k materials may be reduced from that of an integrated circuit that is fabricated with traditional materials, because low k materials differ from traditional materials in properties such as thermal coefficient of expansion, moisture absorption, adhesion to adjacent layers, mechanical strength, and thermal conductivity.

For example, when forming back end of line dual damascene copper interconnect structures, dielectric barrier films, and often a middle etch stop film, is formed between the low k inter layer dielectric layers. The dielectric barrier films perform valuable functions, including forming a diffusion barrier to prevent copper diffusion into the low k inter layer dielectrics, acting as an etch stop layer on top of the copper during the dual damascene via etch process, and acting as a passivation layer to prevent damage, such as exposure to an oxidizing environment and moisture, to the copper during subsequent processing. The middle etch stop layer acts as an etch stop during dual damascene trench etch and enhances the control of the trench depth and the via profile. High etch selectivity between the inter layer dielectric and the middle etch stop layer is generally desired.

It is desirable to have dielectric barrier films and the etch stop films that also have a low dielectric constant, so as to achieve a low overall effective k of the overall dielectric film stack. However, the properties of tradition low k dielectric films have made them inadequate to fulfill the purposes of the barrier and etch stop films. Dielectric barrier and etch stop materials typically include silicon nitride with a k of about seven, silicon carbide with a k of about five, and silicon carbon nitride with a k of about five, deposited using plasma enhanced chemical vapor deposition. These materials have properties that enable them to function well as barriers and etch stops, but they all have relatively high k values.

With the drive toward smaller integrated circuit feature sizes, as mentioned above, and with the use of inter layer dielectrics with lower k values, the dielectric barrier and middle etch stop films tend to have a more significant contribution to the overall effective k value of the dielectric stack in which they are used. When integrated circuit feature sizes become smaller, inter layer dielectric thicknesses tend to become thinner. But the barrier layer and etch stop layer thicknesses do not scale down as much as inter layer dielectric thickness does, due to the requirements on the barrier layers. For example, as the inter layer dielectric thickness decreases from about 7,700 angstroms to about 6,000 to 6,500 angstroms, the dielectric barrier deposition thickness remains substantially constant at about five hundred angstroms. Thus, to reduce the overall dielectric constant of the barrier and middle etch stop films, films with lower k values need to be found.

Plasma enhanced chemical vapor deposition silicon carbide films are very good dielectric barrier and middle etch stop due to their excellent properties, such as good diffusion barrier for copper and moisture, high etch selectivity to carbon doped oxide inter layer dielectric, and industry-friendly plasma enhanced chemical vapor deposition methods. These films are usually deposited at elevated temperatures of between about three hundred centigrade and about four hundred centigrade using trimethylsilane-based chemistry.

One approach to achieve lower k plasma enhanced chemical vapor deposition silicon carbide is to introduce oxygen into the film as it is formed, to reduce the density of the film. This can be accomplished by using precursor gases that include some form of oxygen, such as those with oxygen in their molecular structure, or the introduction of oxygen gas or oxygen-containing gases during the deposition process. Incorporation of oxygen tends to reduce the k value. However, there are problems with oxygenated silicon carbide films. Other approaches to achieving lower k silicon carbide films include the use of novel precursors or post-deposition treatment to increase the porosity of the deposited film. However, these processes are in an early development stage, and as of yet there has been no report of a plasma enhanced chemical vapor deposition oxygen-free silicon carbide material with a k value of less than about four.

What is needed, therefore, is a method of depositing a plasma enhanced chemical vapor deposition silicon carbide based thin film that is substantially oxygen free and which has a dielectric constant of less than about four.

SUMMARY

The above and other needs are met by a substantially oxygen-free silicon carbide layer having a dielectric constant of less than about four. The dielectric constant is preferably less than about three. In various embodiments, the silicon carbide layer is a hydrogenated silicon carbide layer, and in some embodiments the silicon carbide layer is a nitrogen doped hydrogenated silicon carbide layer. Also described is an integrated circuit including the silicon carbide layer.

Also described is a method for forming a substantially oxygen-free silicon carbide layer on a substrate, where the silicon carbide layer has a dielectric constant of less than about four. The substrate is held at a deposition temperature of between about zero centigrade and about one hundred centigrade, and a gas flow of tetramethylsilane is introduced at a rate of no more than about one thousand scientific cubic centimeters per minute. The deposition pressure is held between about one milli Torr and about one hundred Torr, and a radio frequency plasma discharge is produced with a power of no more than about two kilowatts. The plasma discharge is halted when a desired thickness of the silicon carbide layer has been formed.

In this manner, there is provided a silicon carbide film having a dielectric constant of less than about four, which has excellent properties for use in an inter layer dielectric stack. For example, because the silicon carbide film described is substantially oxygen-free, it does not oxidize the underlying copper film when used in such a system. Further, the silicon carbide film tends to exhibit a good etch selectivity with the inter layer dielectric. In addition, the ability of the silicon carbide film to act as a barrier against copper diffusion tends to be quite good, because of the lack of oxygen in the film.

In various embodiments, the method is accomplished in a plasma enhanced chemical vapor deposition reactor. The deposition temperature is preferably held at about twenty-five centigrade, the deposition pressure is preferably held between about five hundred milli Torr and about seven hundred and fifty milli Torr, the gas flow is preferably introduced at a rate of between about twenty-five scientific cubic centimeters per minute and about seventy-five scientific cubic centimeters per minute, and the plasma discharge is preferably produced with a power of between about five hundred watts and about seven hundred and fifty watts. In some embodiments, at least one of helium, nitrogen, argon, methane, and ammonia gas is introduced during the plasma discharge.

In a first specific embodiment, the deposition temperature is held at about twenty-five centigrade, the tetramethylsilane is introduced at a rate of about seventy-five scientific cubic centimeters per minute, helium gas is introduced during the plasma discharge at a rate of about two hundred scientific cubic centimeters per minute, the deposition pressure is held at about five hundred milli Torr, and the plasma discharge is produced with a power of about eight hundred watts.

In a second specific embodiment, the deposition temperature is held at about twenty-five centigrade, the tetramethylsilane is introduced at a rate of about twenty-five scientific cubic centimeters per minute, nitrogen gas is introduced during the plasma discharge at a rate of about four hundred scientific cubic centimeters per minute, the deposition pressure is held at about seven hundred and fifty milli Torr, and the plasma discharge is produced with a power of about six hundred watts.

In a third specific embodiment, the deposition temperature is held at about twenty-five centigrade, the tetramethylsilane is introduced at a rate of about twenty-five scientific cubic centimeters per minute, methane gas is introduced during the plasma discharge at a rate of about two hundred scientific cubic centimeters per minute, the deposition pressure is held at about seven hundred and fifty milli Torr, and the plasma discharge is produced with a power of about seven hundred and fifty hundred watts.

In various embodiments there is an additional step of treating the silicon carbide layer with at least one of a helium plasma and a hydrogen plasma at a temperature of no more than about four hundred centigrade. In other embodiments there is an additional step of treating the silicon carbide layer with a thermal anneal at a temperature of between about one hundred centigrade and about four hundred centigrade under one of a vacuum environment and an inert gas ambient environment.

Further described is an inter layer dielectric stack, with a bottom layer of a substantially oxygen-free silicon carbide material having a dielectric constant of less than about four, a middle layer of a low k material, and a top layer of a substantially oxygen-free silicon carbide material having a dielectric constant of less than about four. In one embodiment, the middle layer of the low k material includes a first layer and a second layer of the low k material, with an intervening layer of a substantially oxygen-free silicon carbide material having a dielectric constant of less than about four. An integrated circuit including the inter layer dielectric stack is also described.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

This invention includes methods to deposit an oxygen-free silicon carbide film with a dielectric constant as low as 2.92 using plasma enhanced chemical vapor deposition techniques and reactors, with tetramethylsilane-based precursors. Currently there has no public report of the deposition of plasma enhanced chemical vapor deposition oxygen-free silicon carbide material with a dielectric constant of less than about four. A distinct feature of this invention is that the deposition is carried out at a substantially lower temperature compared to the conventional silicon carbide deposition temperature. In the embodiments presented herein, the deposition temperature is between about zero centigrade and about one hundred centigrade, whereas typical silicon carbide films are deposited at a temperature of between about three hundred centigrade and about four hundred centigrade.

Different reaction chemistries are described herein, and preferred embodiments of invention are presented. Properties of the ultra low dielectric constant silicon carbide films deposited using some preferred embodiments of this invention are also presented. A mechanism for the reduction of the dielectric constant in ultra low dielectric constant silicon carbide films is proposed.

The present invention is directed to a method for forming a silicon carbide film on a substrate comprising the steps of: (a) keeping the substrate at a deposition temperature of between about zero centigrade and about one hundred centigrade; (b) providing tetramethylsilane in a gas flow amount up to about one thousand scientific cubic centimeters per minute; (c) reaching a pressure between about one milli Torr and one hundred Torr; (d) plasma discharge with radio frequency power up to about two kilowatts, and (e) depositing the silicon carbide film on the substrate. The deposition can be carried out in any plasma enhanced chemical vapor deposition system available.

In the preferred embodiments of this invention, the deposition is carried out at a temperature of about twenty-five centigrade, where the pressure of step (c) is between about five hundred milli Torr and about seven hundred and fifty milli Torr. The tetramethylsilane is preferably provided in a gas flow of between about twenty-five scientific cubic centimeters per minute and about seventy-five scientific cubic centimeters per minute, in a plasma discharge with a radio frequency power in a preferred range of between about five hundred watts and about seven hundred and fifty watts. In preferred embodiments, the tetramethylsilane in step (b) is the primary silicon-containing precursor, and the plasma discharge of step (b) includes one or more of gases such as helium, nitrogen, argon, methane, and ammonia.

Figure 1:
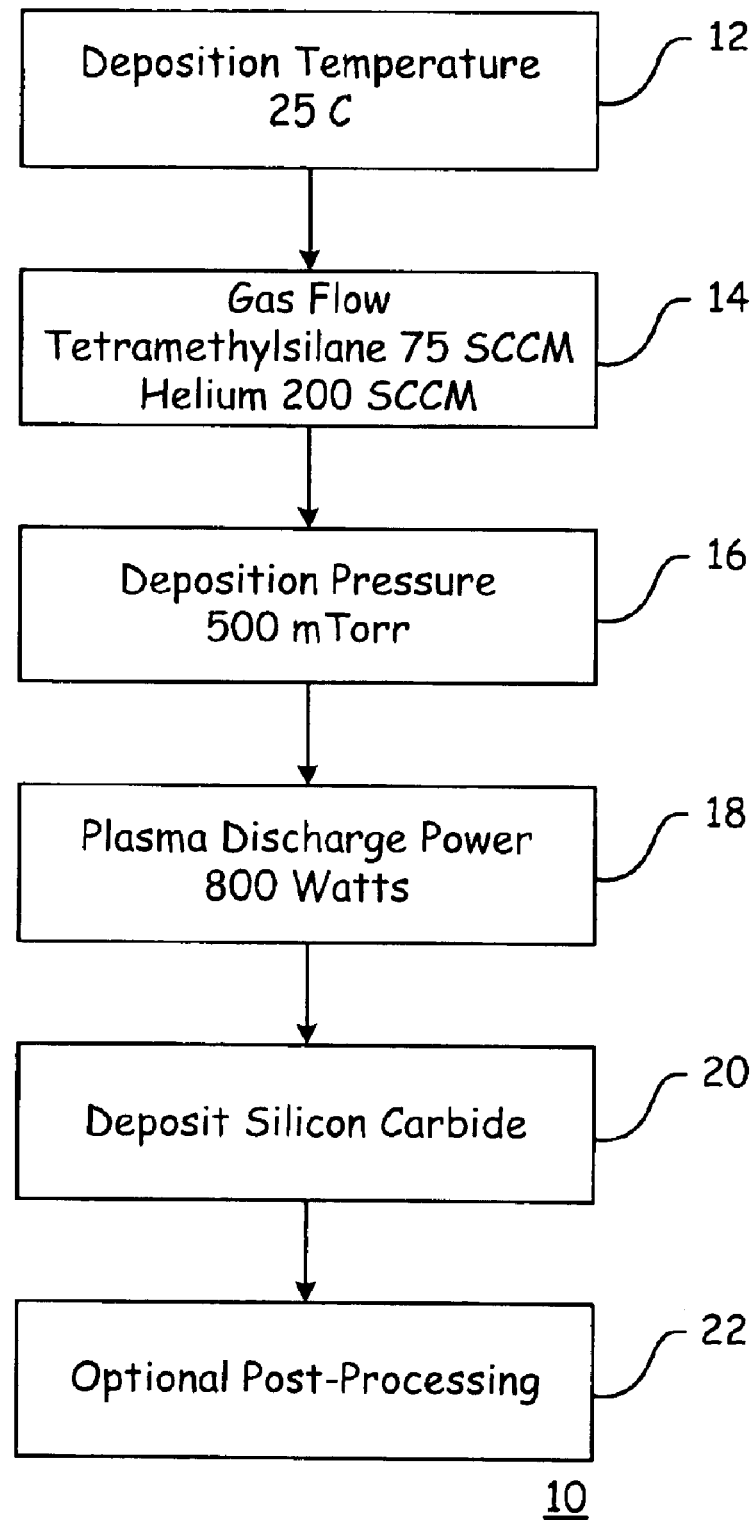
FIG. 1 is a flow chart depicting the process steps for a first preferred embodiment of a method for depositing an ultra low dielectric constant oxygen-free silicon carbide film according to the present invention.

FIG. 1 is a flow chart of the deposition sequence 10 of preferred embodiment 1 of this disclosure. In this embodiment, the temperature is twenty-five centigrade as given in block 12. A mixture of seventy-five scientific cubic centimeters per minute of tetramethylsilane and two hundred scientific cubic centimeters per minute of inert gases is used in the plasma discharge as given in block 14, with a pressure of five hundred milli Torr as given in block 16. Helium is used as an example of the inert gas of this embodiment. Other candidates for the inert gas are argon or mixture of helium and argon. The inert gases are preferably used as the carrier gas for the tetramethylsilane, and help to strike and maintain a uniform and stable plasma discharge. The inert gases are preferably not actively involved in the reaction during the deposition of the silicon carbide film. The power is about eight hundred watts as given in block 18 The silicon carbide film deposited using this embodiment as given in block 20 is a substantially pure hydrogenated silicon carbide ($SiC_xH_y$) without any dopants, and is substantially oxygen-free.

The final post-deposition treatment as given in block 22 is optional and can be used to preferably stabilize and control the deposited silicon carbide film properties. Examples of such post-deposition treatments include helium plasma treatment at a temperature of no more than about four hundred and fifty centigrade, a hydrogen plasma treatment at a temperature of no more than about four hundred and fifty centigrade, and a thermal anneal at a temperature of between about one hundred centigrade and about four hundred and fifty centigrade in a vacuum environment or in an inert gas ambient environment.

Figure 2:
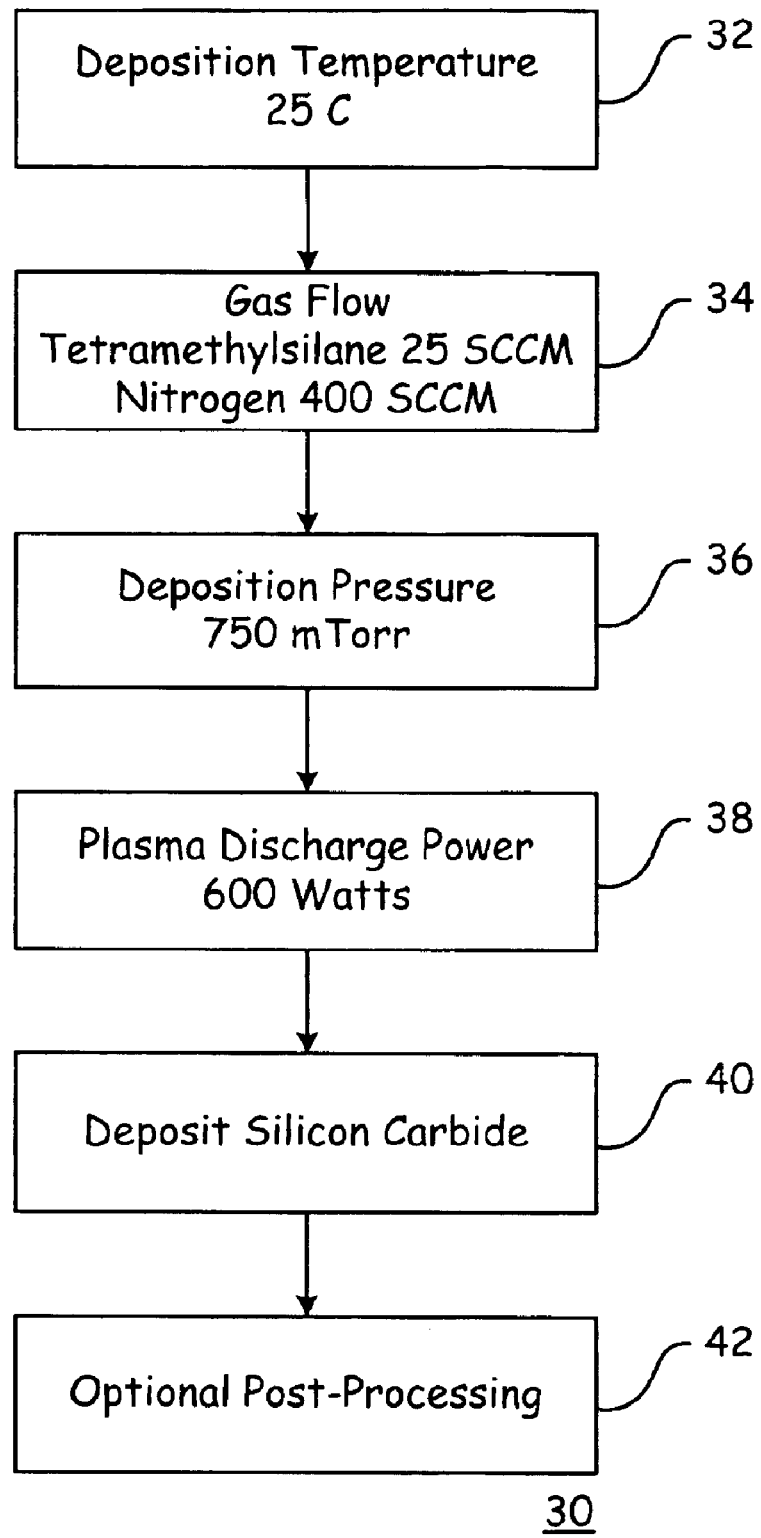
FIG. 2 is a flow chart depicting the process steps for a second preferred embodiment of the method for depositing an ultra low dielectric constant oxygen-free silicon carbide film according to the present invention.

FIG. 2 is a flow chart of the deposition sequence 30 of preferred embodiment 2 of this disclosure. The deposition temperature is twenty-five centigrade as given in block 32. The main difference between this embodiment and embodiment 1 is that a mixture of twenty-five scientific cubic centimeters per minute of tetramethylsilane and four hundred scientific cubic centimeters per minute of nitrogen-containing gases is used during the film deposition. In this embodiment, a mixture of tetramethylsilane and ammonia gases or a mixture of tetramethylsilane, nitrogen and ammonia is used to deposit the silicon carbide film. Inert carrier gases such helium and argon can optionally be used during the deposition without affecting the silicon carbide film properties. The deposition pressure is seven hundred and fifty milli Torr as given in block 36, and the power as given in block 38 is six hundred watts.

The deposition reaction as given in block 40 of this embodiment is different as compared to that of embodiment 1, because the nitrogen-containing gases are actively involved in the deposition reaction, due to the presence of active nitrogen and hydrogen radicals in the plasma. As a result, an ultra low dielectric constant hydrogenated silicon carbide film with nitrogen dopants (silicon carbon nitride, or $SiC_xN_yH_z$) is produced using this embodiment. Basic chemistry and physics teach that this film should retain good dielectric barrier and etch stop properties. The post processing as given in block 42 is optional, as described above.

Figure 3:
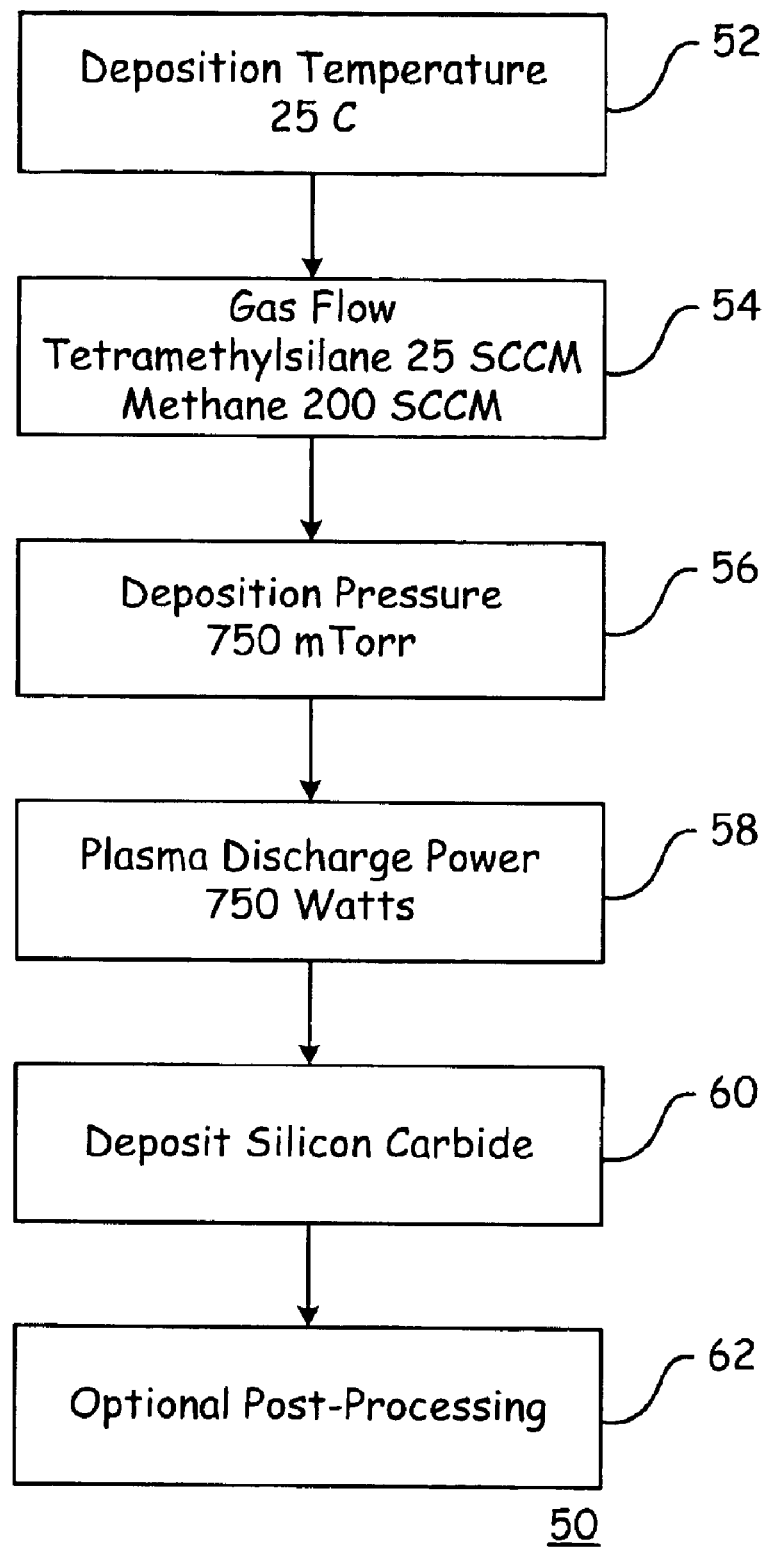
FIG. 3 is a flow chart depicting the process steps for a third preferred embodiment of the method for depositing an ultra low dielectric constant oxygen-free silicon carbide film according to the present invention.

FIG. 3 is a flow chart of the deposition sequence 50 of preferred embodiment 3 of this disclosure. In this embodiment, the deposition temperature is twenty-five centigrade, and a mixture of twenty-five scientific cubic centimeters per minute of tetramethylsilane and two hundred scientific cubic centimeters per minute of methane gases is used in the film deposition. Other hydrocarbon gases, such as ethane or a mixture of methane and ethane, can be used to replace the methane in this embodiment. The hydrocarbon gases are actively involved in the deposition reaction with tetramethylsilane, to deposit a hydrogenated silicon carbide film ($SiC_xH_y$).

Inert carrier gases such helium and argon are optionally used during the deposition as given in block 60 without affecting the silicon carbide film properties. The tetramethylsilane to methane flow ratio is preferably tuned to adjust the carbon content of the silicon carbide film, which affects the etch selectivity between the low k inter layer dielectric and the hydrogenated silicon carbide film during a dual damascene via etch. The deposition pressure as given in block 56 is seven hundred and fifty milli Torr, and the power as given in block 58 is seven hundred and fifty watts. As before, the post-processing as given in block 62 and described above is optional.

Some basic film properties of the ultra low dielectric constant silicon carbide films deposited using preferred embodiments 1 and 2 of this invention are presented in the following portion of the disclosure. The films were all deposited in an FxP deposition system manufactured by Trikon Technologies, Inc. of Fountain Valley, Calif.

The dielectric constants of the films were determined by capacitance-voltage measurement and analysis of fabricated metal-insulator-semiconductor capacitors. To fabricate a metal-insulator-semiconductor capacitor, approximately one thousand angstroms of the ultra low dielectric constant silicon carbide film is deposited onto a low resistivity silicon substrate. Aluminum or copper dots are then sputtered onto the film using a shadow mask. The capacitance-voltage measurements are performed at a frequency of about one megahertz. The refractive indices are measured using an Opti-Probe refractometer manufactured by Therma-Wave, Inc. of Fremont, Calif.

Tables 1 and 2 below provide the dielectric constant and refractive index of the ultra low dielectric constant silicon carbide films described herein. Also included are a dielectric constant and refractive index of more traditional silicon carbide films. These data show that the ultra low dielectric constant silicon carbide films deposited using the preferred embodiments according to this invention have very low dielectric constants and refractive indices.

TABLE 1

Dielectric constant of ultra low-k silicon carbide films

| Ultra low-k $SiC_xH_y$ Embodiment 1 | Ultra low-k $SiC_xN_yH_z$ Embodiment 2 | Traditional $SiC_xH_y$ | Traditional $SiC_xN_yH_z$ |
|---|---|---|---|
| 2.92 | 3.38 | 4.8 | 5.1 |

TABLE 2

Refractive index of ultra low-k silicon carbide films

| Ultra low-k $SiC_xH_y$ Embodiment 1 | Ultra low-k $SiC_xN_yH_z$ Embodiment 2 | Traditional $SiC_xH_y$ | Traditional $SiC_xN_yH_z$ |
|---|---|---|---|
| 1.6 | 1.59 | 2 | 1.93 |

The chemical compositions of the films described herein have been determined by Rutherford backscattering spectrometry and hydrogen forward scattering. Fourier transform infrared spectroscopy analysis is used to study the film's chemical bonding structure. Films of about three thousand angstroms in thickness were used in these analyses.

Table 3 below shows the chemical composition of ultra low dielectric constant silicon carbide films. Also included are the chemical compositions of more traditional silicon carbide films. It is apparent that the ultra low dielectric constant pure hydrogenated silicon carbide ($SiC_xH_y$) film is successfully produced using preferred embodiment 1. It is further apparent that nitrogen atoms are incorporated into the ultra low dielectric constant silicon carbide film deposited using preferred embodiment 2, to form the ultra low-k silicon carbon nitride ($SiC_xN_yH_x$) film. It can also be seen that the atomic ratios of carbon to silicon for the ultra low dielectric constant silicon carbide films are significantly higher than the more traditional films that exhibit a higher dielectric constant.

TABLE 3

Atomic chemical composition of ultra low-k silicon carbide films

| Films | Si (%) | C (%) | H (%) | N (%) |
|---|---|---|---|---|
| Ultra low-k $SiC_xH_y$ Embodiment 1 | 16 | 28 | 56 | 0 |
| Ultra low-k $SiC_xN_yH_z$ Embodiment 2 | 11.9 | 22.3 | 56 | 8.8 |
| Traditional $SiC_xH_y$ | 25.3 | 24.7 | 50 | 0 |
| Traditional $SiC_xN_yH_z$ | 24.5 | 17.5 | 46 | 12 |

Figure 4:
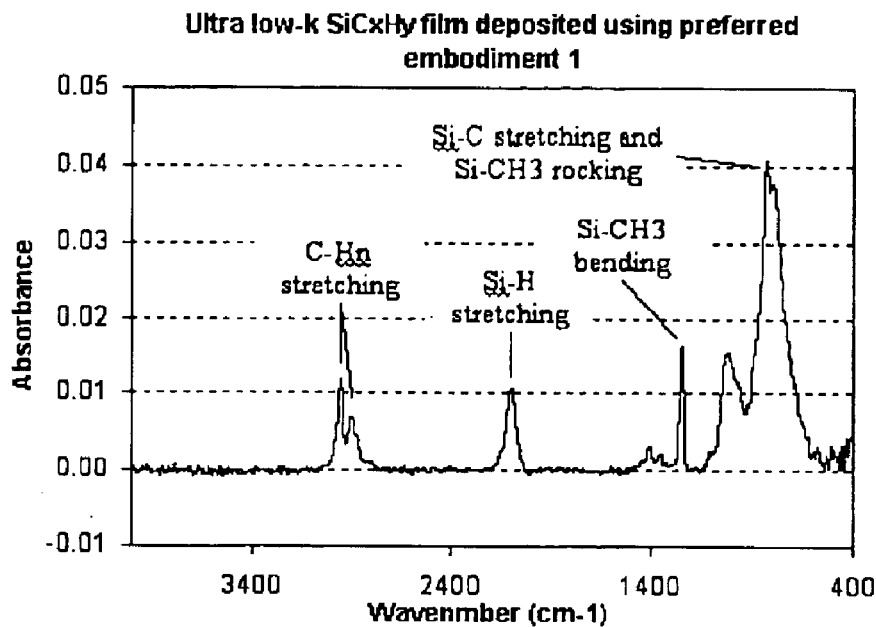
FIG. 4 is a chart depicting the Fourier transform infrared spectroscopy absorbance spectrum for the first preferred embodiment of the method for depositing an ultra low dielectric constant oxygen-free silicon carbide film according to the present invention.
Figure 5:
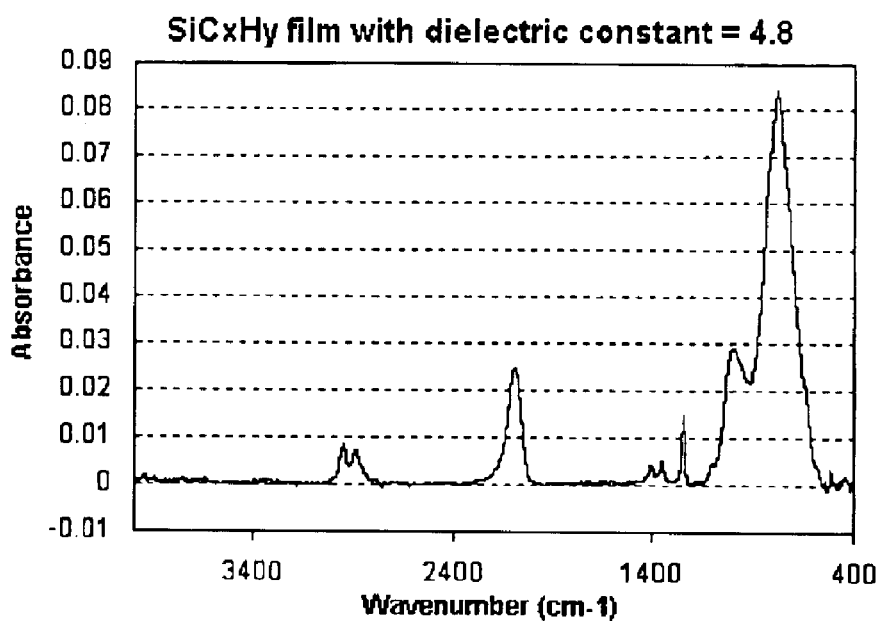
FIG. 5 is a chart depicting the Fourier transform infrared spectroscopy absorbance spectrum for a more traditional silicon carbide film having a higher dielectric constant.

FIG. 4 depicts the Fourier transform infrared spectroscopy spectrum of the ultra low dielectric constant silicon carbide film ($SiC_xH_y$) that is deposited using preferred embodiment 1, and a more traditional silicon carbide film ($SiC_xH_y$). The ultra low dielectric constant silicon carbide film has a similar spectrum pattern as compared to a silicon carbide film with a dielectric constant of 4.8. The major difference is that the ultra low dielectric constant silicon carbide film has a much higher Si—CH3 bending absorbance peak intensity (~1,250 $cm^{-1}$) and C—$H_n$ (n=1,2,3) stretching absorbance peak intensity (2,900–2,960 $cm^{-1}$) as normalized to the main peak around wave number 800 $cm^{-1}$. The Si—$CH_3$/Si—C and C—$H_n$/Si—C peak intensity ratios of the ultra low dielectric constant $SiC_xH_y$ film in FIG. 4 is more than twice that of the more traditional $SiC_xH_y$ film as depicted in FIG. 5.

This analysis suggests that more methyl-related groups ($CH_3$, $CH_2$) are attached to the silicon atoms and less Si—C network is formed in the ultra low dielectric constant silicon carbide film. The Si—C network is a very dense network. Without being bound by theory, it is proposed that the incorporation of more large methyl-related groups and disordering of the Si—C network make the present silicon carbide film more porous and cause the reduction in the dielectric constant. This proposal tends to also be confirmed by the change in the C/Si atomic ratio, as compared to traditional films with higher dielectric constants, as shown in Table 3 above. The pure Si—C network has a C/Si ratio of close to one, while the ultra low dielectric constant silicon carbide films described herein have C/Si ratios of close to two. The higher C/Si atomic ratio of the ultra low dielectric constant silicon carbide film suggests that more methyl-related groups are attached to the silicon atoms.

Figure 6:
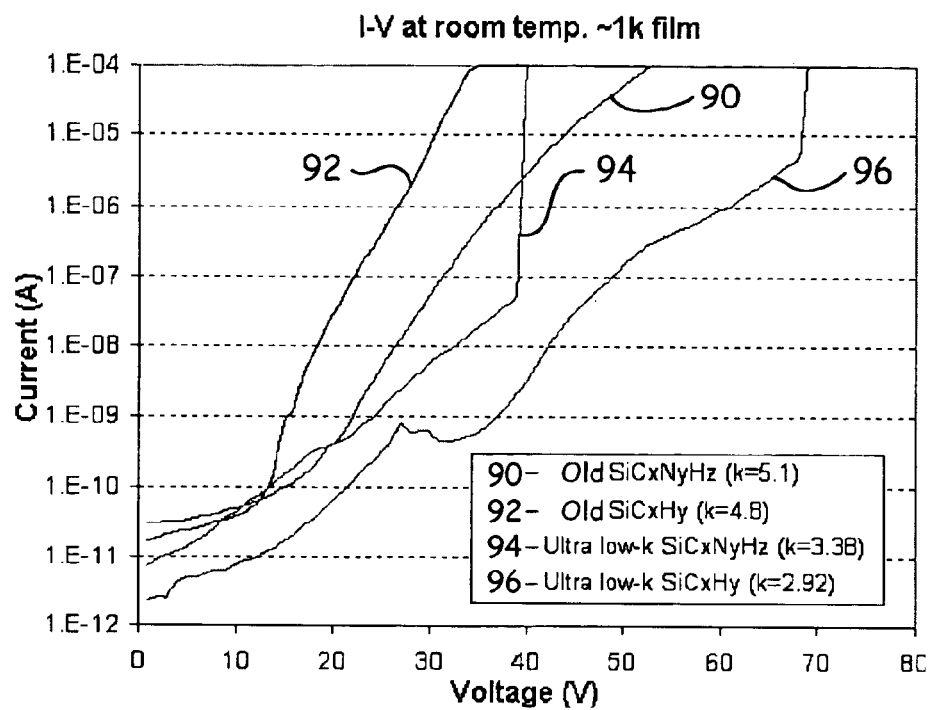
FIG. 6 is a chart depicting the current-voltage leakage characteristics for two embodiments of an ultra low dielectric constant oxygen-free silicon carbide film according to the present invention and two more traditional silicon carbide films having higher dielectric constants.

Low leakage current is highly desirable for dielectric barrier and etch stop films that are to be used for back end of line interconnects. FIG. 6 shows the current-voltage characteristics of the ultra low dielectric constant silicon carbide films 94 and 96 at room temperature. Current-voltage characteristics of traditional silicon carbide films 90 and 92 are also included as references. Current-voltage tests were done on metal-insulator-semiconductor capacitors with copper as the gate contact. All films tested have thicknesses of about one thousand angstroms. FIG. 6 shows that the ultra low dielectric constant silicon carbide films 94 and 96 have low leakage current, and breakdown fields that are higher than about four millivolts per centimeter. In particular, the ultra low dielectric constant $SiC_xH_y$ 96 with a dielectric constant of 2.92 has a significantly lower leakage current than traditional silicon carbide films 90 and 92 with a higher dielectric constant.

Figure 7:
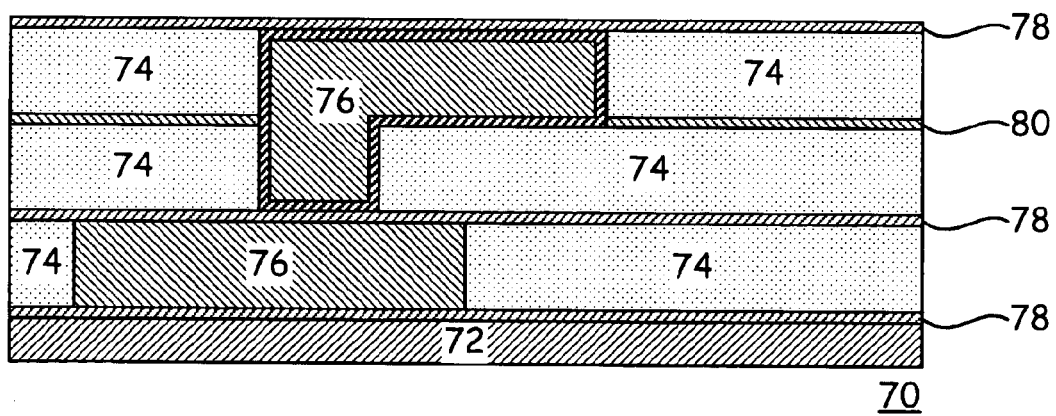
FIG. 7 is a cross sectional depiction of a portion of an integrated circuit with an inter layer dielectric stack including ultra low dielectric constant oxygen-free silicon carbide films according to the present invention.

With reference now to FIG. 7, there is depicted a portion of an integrated circuit 70. The integrated circuit 70 includes a substrate 72, which is preferably formed of a semiconducting material, such as at least one of silicon, germanium, and a III–V compound such as gallium arsenide. The substrate 72 also preferably includes circuitry formed therein, which circuitry is not depicted in the figure. The integrated circuit 70 also includes a dielectric stack of materials 74, 78, and 80. The layers 74 are preferably formed of a low k material, as described above. The layers 78 and option layer 80 are preferably etch stop and barrier layers formed of the ultra low dielectric constant substantially oxygen-free silicon carbide material formed by the processes as described above. As introduced above, such layers are useful in combination with copper dual damascene structures 76.

In summary, this invention presents methods to deposit ultra low dielectric constant plasma enhanced chemical vapor deposition silicon carbide films that are substantially oxygen-free. Three preferred embodiments are proposed. Basic properties of the ultra low dielectric constant silicon carbide films deposited using the preferred embodiments are presented. A mechanism for the dielectric constant reduction is proposed.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for forming on a substrate a substantially oxygen-free silicon carbide layer having a dielectric constant of less than about four, the method comprising the steps of:

holding the substrate at a deposition temperature of between about zero centigrade and about one hundred centigrade, introducing a gas flow of tetramethylsilane at a rate of no more than about one thousand scientific cubic centimeters per minute, holding a deposition pressure of between about one milli Torr and about one hundred Torr, producing a radio frequency plasma discharge with a power of no more than about two kilowatts, and halting the plasma discharge when a desired thickness of the silicon carbide layer has been formed.

2. The method of claim 1, wherein the method is accomplished in a plasma enhanced chemical vapor deposition reactor.

3. The method of claim 1, wherein the deposition temperature is held at about twenty-five centigrade.

4. The method of claim 1, wherein the deposition pressure is held between about five hundred milli Torr and about seven hundred and fifty milli Torr.

5. The method of claim 1, wherein the gas flow is introduced at a rate of between about twenty-five scientific cubic centimeters per minute and about seventy-five scientific cubic centimeters per minute.

6. The method of claim 1, wherein the plasma discharge is produced with a power of between about five hundred watts and about seven hundred and fifty watts.

7. The method of claim 1, further comprising the step of introducing at least one of helium, nitrogen, argon, methane, and ammonia gas during the plasma discharge.

8. The method of claim 1, wherein the deposition temperature is held at about twenty-five centigrade, the tetramethylsilane is introduced at a rate of about seventy-five scientific cubic centimeters per minute, helium gas is introduced during the plasma discharge at a rate of about two hundred scientific cubic centimeters per minute, the deposition pressure is held at about five hundred milli Torr, and the plasma discharge is produced with a power of about eight hundred watts.

9. The method of claim 1, wherein the deposition temperature is held at about twenty-five centigrade, the tetramethylsilane is introduced at a rate of about twenty-five scientific cubic centimeters per minute, nitrogen gas is introduced during the plasma discharge at a rate of about four hundred scientific cubic centimeters per minute, the deposition pressure is held at about seven hundred and fifty milli Torr, and the plasma discharge is produced with a power of about six hundred watts.

10. The method of claim 1, wherein the deposition temperature is held at about twenty-five centigrade, the tetramethylsilane is introduced at a rate of about twenty-five scientific cubic centimeters per minute, methane gas is introduced during the plasma discharge at a rate of about two hundred scientific cubic centimeters per minute, the deposition pressure is held at about seven hundred and fifty milli Torr, and the plasma discharge is produced with a power of about seven hundred and fifty hundred watts.

11. The method of claim 1, further comprising the step of treating the silicon carbide layer with at least one of a helium plasma and a hydrogen plasma at a temperature of no more than about four hundred centigrade.

12. The method of claim 1, further comprising the step of treating the silicon carbide layer with a thermal anneal at a temperature of between about one hundred centigrade and about four hundred centigrade under one of a vacuum environment and an inert gas ambient environment.

* * * * *